United States Patent
Aigner

(10) Patent No.: US 9,979,377 B1
(45) Date of Patent: May 22, 2018

(54) FREQUENCY FILTER

(71) Applicant: TriQuint Semiconductor, Inc., Hillsboro, OR (US)

(72) Inventor: Robert Aigner, Ocoee, FL (US)

(73) Assignee: Qorvo US, Inc., Greensboro, NC (US)

( * ) Notice: Subject to any disclaimer, the term of this patent is extended or adjusted under 35 U.S.C. 154(b) by 764 days.

(21) Appl. No.: 13/903,821

(22) Filed: May 28, 2013

(51) Int. Cl.
*H04B 1/40* (2015.01)
*H03H 9/205* (2006.01)
*H04W 4/00* (2018.01)

(52) U.S. Cl.
CPC ........... *H03H 9/205* (2013.01); *H04W 4/008* (2013.01)

(58) Field of Classification Search
CPC .......... G06F 17/50; H03H 9/64; H03H 9/205; A01B 12/006; H04W 4/008; H04W 76/023
USPC .................. 455/41.1, 41.2, 41.3, 77, 78, 81
See application file for complete search history.

(56) References Cited

U.S. PATENT DOCUMENTS

| | | | | |
|---|---|---|---|---|
| 5,717,367 A * | 2/1998 | Murai | ........... | H03H 9/25 310/313 D |
| 6,351,197 B1 * | 2/2002 | Selmeier | ........... | H03H 9/6483 333/195 |
| 8,701,065 B1 * | 4/2014 | Silver | ........... | H03H 9/465 333/133 |
| 2003/0060170 A1 * | 3/2003 | Tikka | ........... | H03H 9/009 455/73 |
| 2008/0007369 A1 * | 1/2008 | Barber | ........... | H03H 9/02086 333/189 |
| 2009/0009268 A1 * | 1/2009 | Edmonson | ........... | G01N 29/022 333/190 |
| 2010/0074240 A1 * | 3/2010 | Jian | ........... | H04B 1/0057 370/339 |
| 2011/0018654 A1 * | 1/2011 | Bradley | ........... | H03H 9/706 333/133 |
| 2011/0235557 A1 * | 9/2011 | Jian | ........... | H03H 9/542 370/282 |
| 2012/0161862 A1 * | 6/2012 | Uzunov, IV | ........... | H03H 9/545 327/557 |
| 2012/0169240 A1 * | 7/2012 | MacFarlane | ........... | H02M 1/4225 315/152 |
| 2013/0083044 A1 * | 4/2013 | Zuo | ........... | H03H 9/2405 345/520 |
| 2013/0109332 A1 * | 5/2013 | Aigner | ........... | H03H 9/02102 455/90.2 |
| 2014/0035702 A1 * | 2/2014 | Black | ........... | H03H 7/075 333/186 |
| 2014/0282311 A1 * | 9/2014 | Turner | ........... | H03H 9/465 716/104 |

* cited by examiner

*Primary Examiner* — Md Talukder
(74) *Attorney, Agent, or Firm* — Withrow & Terranova, P.L.L.C.

(57) ABSTRACT

Embodiments may provide, among other things, a frequency filter including one or more series resonators and one or more shunt resonators. The series resonators may have a first periodicity and the shunt resonators may have a second periodicity. The frequency filter may include a control circuit that may be configured to cause a change in frequency of the one or more series resonators or the one or more shunt resonators of less than the first or second periodicity, respectively, and the change in frequency may result in a change to a passband associated with the frequency filter of at least the first or second periodicity. Additional embodiments may be described and/or claimed herein.

23 Claims, 5 Drawing Sheets

FREQUENCY FILTER

FIELD

Embodiments of the present disclosure relate generally to the field of circuits, and more particularly to frequency filters.

BACKGROUND

Frequency filters are utilized in many applications. One of the more prominent uses is in communication devices. For example, communication devices operating on a cellular network may have a relatively small specified frequency range on which to operate. A frequency filter may work to allow only those frequencies within the specified frequency range to pass through and may attenuate any frequencies outside of that range. The range of frequencies a frequency filter allows to pass through defines the passband of the frequency filter whereas those frequencies outside of that range are considered sideband frequencies.

Where a communication device only operates within a single specified frequency range, a single frequency filter may be sufficient; however, in many applications, a communication device may need to operate within two or more specified frequency ranges. Where a communication device may need to operate within two or more specified frequency ranges a frequency filter for each specified frequency range may be necessary. For example, it is not uncommon for cellular devices to contain 15 filters to operate on 15 different bands. Under the current state of the art, frequency filters are essentially limited to a single frequency range. Tunable filters may help in this, but the tuning range of a tunable filter is very limited. Tunable filters may be capable of small frequency adjustments to the passband through an electrical control signal, for example, however, the passband of current tunable frequency filters cannot be adjusted by more than about ten percent without experiencing severe degradation of the signal.

BRIEF DESCRIPTION OF THE DRAWINGS

Embodiments are illustrated by way of example and not by way of limitation in the figures of the accompanying drawings, in which like references indicate similar elements.

DETAILED DESCRIPTION

Figure 1:
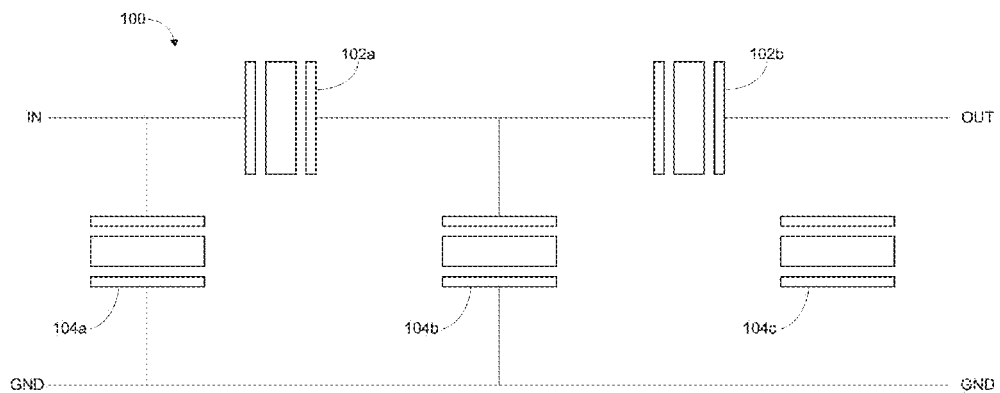
FIG. 1 depicts an illustrative frequency filter, according to embodiments of the present disclosure.

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms comprising, having, and including are synonymous, unless the context dictates otherwise.

The phrase "coupled with," along with its derivatives, may be used herein. Coupled may mean that two or more elements are in direct physical or electrical contact. However, coupled may also mean that two or more elements indirectly contact each other, but yet still cooperate or interact with each other, and may mean that one or more other elements are coupled or connected between the elements that are said to be coupled with each other.

As used herein, period may refer to the frequency distance from one resonance to the next higher or lower resonance of a resonator. The period from one resonance to the next higher or lower resonance of the resonator may or may not be equal for all resonances of the resonator. For example, a bulk acoustic wave (BAW) resonator constructed on acoustic reflector stacks may have periods that vary slightly from one another. Periodicity, as used herein, may refer to a characteristic period of a resonator. In some embodiments the characteristic period may be an average of the periods of the resonator.

Embodiments may include a frequency filter circuit having one or more series resonators and one or more shunt resonators. In embodiments, individual series resonators of the one or more series resonators may have multiple periodic resonances with a first periodicity. Individual shunt resonators of the one or more shunt resonators may have multiple periodic resonances with a second periodicity that may be different from the first periodicity. In embodiments, a control circuit may be coupled with the one or more series resonators or the one or more shunt resonators. The control circuit may be configured to cause a change in frequency of the one or more series resonators or the one or more shunt resonators of less than the first or second periodicity, respectively, and the change in frequency results in a change to a passband associated with the frequency filter of at least the first or second periodicity. Various embodiments will be described in further detail below with reference to the figures.

FIG. 1 depicts an illustrative frequency filter 100 having a ladder topology, according to embodiments of the present disclosure. The frequency filter may include one or more series resonators 102a-102b and one or more shunt resonators 104a-104c.

The series resonators 102a and 102b may each have multiple periodic resonances with a first periodicity, where the periodicity may represent the frequency difference between the periodic resonances. For example, if a resonator has multiple periodic resonances at 1.90 gigahertz (GHz), 2.16 GHz, and 2.42 GHz then the periodicity of the resonator would be 0.26 GHz, or 260 megahertz (MHz). The shunt resonators 104a-104c may also each have multiple periodic resonances with a second periodicity that may be different from the first periodicity. In embodiments, the series resonators and the shunt resonators may be selected such that the periodic resonances of the series resonators interleave with those of the shunt resonators.

A frequency filter in a ladder topology may have a passband where the frequency of the shunt resonators may be positioned slightly below the frequency of the series resonators, such that max |Z| of the shunt resonators may line up with min |Z| of the series resonators, this is discussed in further detail in reference to FIG. 2, below. As a result, when the series resonators and the shunt resonators have multiple periodic resonances, a frequency adjustment to the series resonators and/or the shunt resonators of a small percentage may result in a much larger adjustment on the passband of the frequency filter. As used herein, passband may be a frequency or a range of frequencies that a frequency filter may allow to pass through the frequency filter with little to no attenuation. For example, it may be sufficient to tune the resonators by 5-10% to achieve a 50% tuning range for the frequency filter. This is discussed in greater detail in reference to FIGS. 2, 3 and 4, below.

The 5-10% tuning, discussed above, may be accomplished by adjusting the series resonators or the shunt resonators by the full 5-10% or both series and shunt resonators may be adjusted to result in an aggregate 5-10% tuning. In embodiments where both the series resonators and the shunt resonators may be adjusted to achieve the desired passband, it will be appreciated that the resulting effect on the passband may be magnified. For instance, if both series resonators and shunt resonators are tuned by 10%, the effective change in the passband may be 100% or more.

Frequency filter 100 is depicted herein as a ladder topology; however, any such topology with similar passband characteristics is contemplated by this disclosure. Such topologies include, but are not limited to ladder and lattice topologies.

Figure 2:
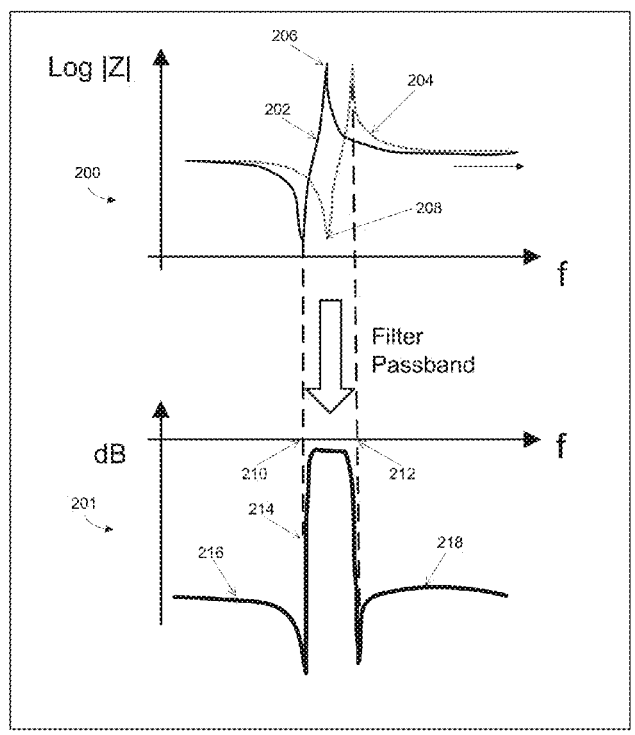
FIG. 2 depicts an illustrative passband associated with a frequency filter, according to some embodiments of the present disclosure.

FIG. 2 illustrates a depiction of a frequency graph 200 demonstrating a single periodic resonance for the series resonators 102a-102b and shunt resonators 104a-104c of FIG. 1 where the series resonators and shunt resonators may have multiple periodic resonances. Graph 201 illustrates the resulting filter passband such an arrangement may have. The vertical axis for graph 200 represents a value of Log |Z|, while the vertical axis of graph 201 represents a decibel (dB) level. The horizontal axes for both graphs 200 and 201 represent frequency.

Line 202 of graph 200 represents one resonance associated with the shunt resonators while line 204 represents one resonance associated with the series resonators. As can be seen, max |Z| of the shunt resonators, represented here as 206, may align with the min |Z| of the series resonators, represented here as 208. This may effectively result in a filter passband between the min |Z| of the shunt resonators and the max |Z| of the series resonators, as depicted by the dashed lines and arrow extending from graph 200 to graph 201.

Graph 201 depicts the resulting passband 214 such a filter may have. Passband 214 encompasses the frequencies between 210 and 212. The frequencies between 210 and 212 may be allowed to pass through such a filter without little to no attenuation. The side bands 216-218, however, may be blocked by the frequency filter and may therefore be highly attenuated, as depicted herein by the reduced dB level.

In the interest of clarity this illustration depicts the single periodic resonance where the passband occurs. It will be appreciated that other periodic resonances may be present where the series resonators and shunt resonators have multiple periodic resonances, as depicted in FIGS. 3 and 4 below.

Figure 3:
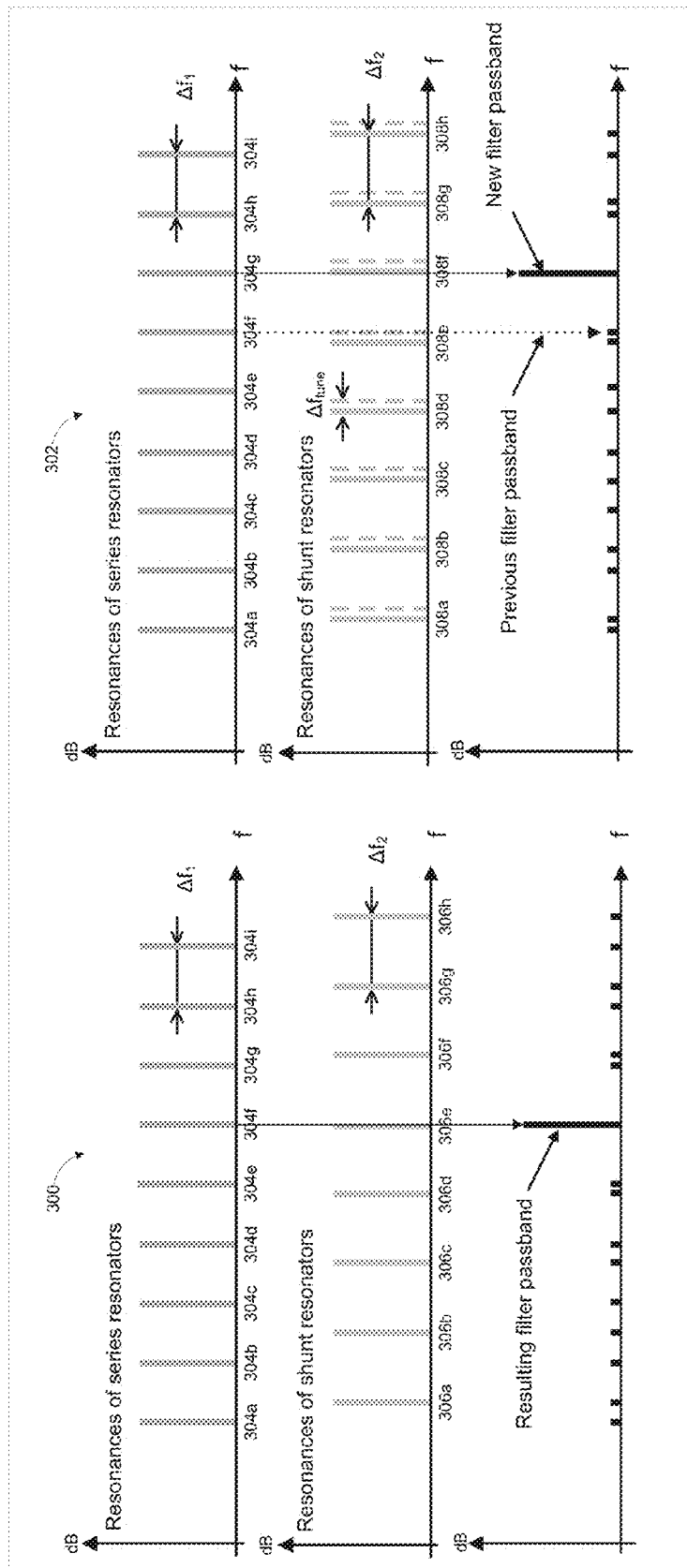
FIG. 3 depicts an illustrative tuning of a frequency filter, according to some embodiments of the present disclosure.
Figure 4:
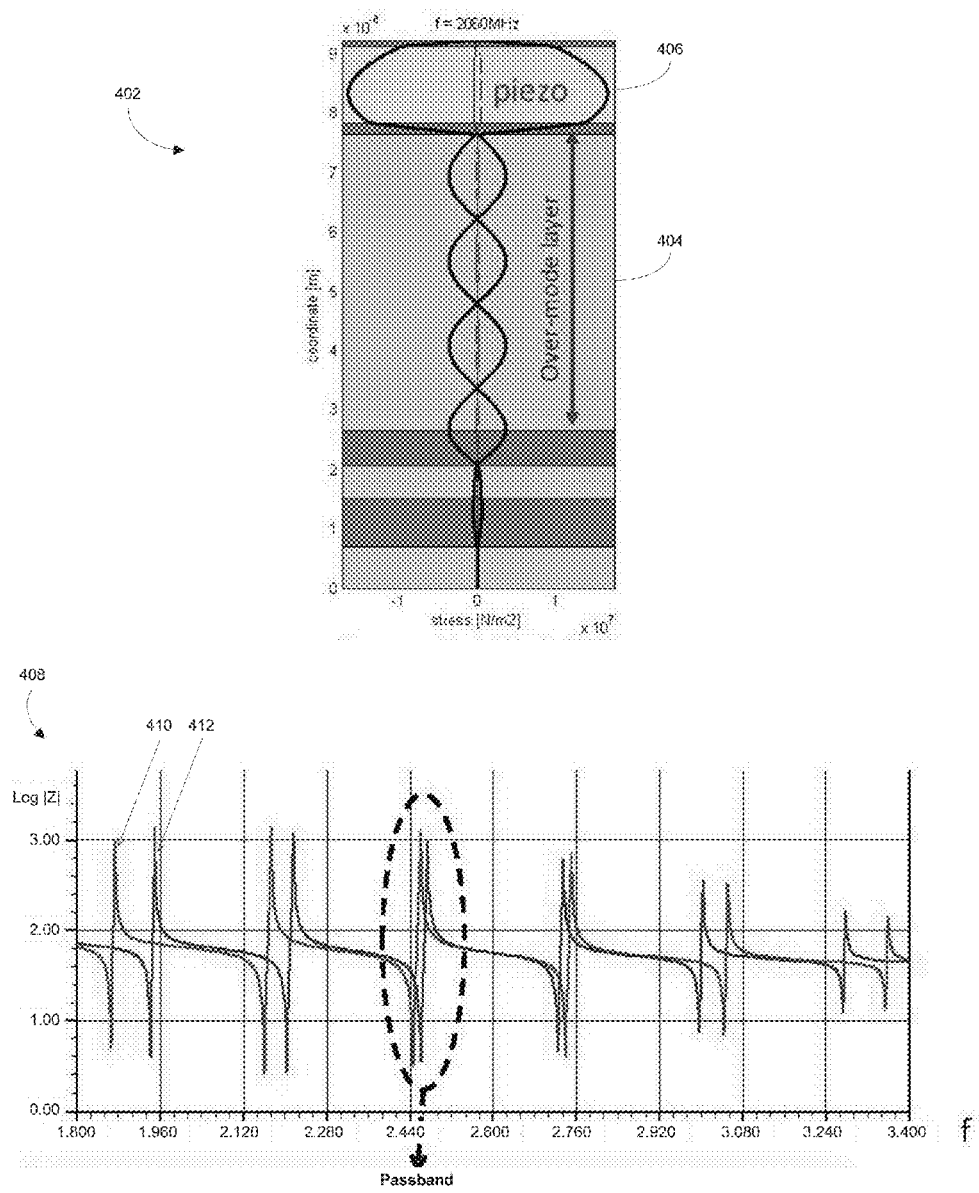
FIG. 4 depicts a bulk acoustic wave resonator and an illustrative tuning of a frequency filter using bulk acoustic wave (BAW) resonators, according to some embodiments of the present disclosure.

FIG. 3 depicts an illustrative tuning of a passband of a frequency filter, such as frequency filter 100 of FIG. 1 above, according to some embodiments of the present disclosure. Graph 300 represents a frequency filter having series resonators at periodic resonances of 304a-304i and shunt resonators at periodic resonances of 306a-306h. The horizontal axis in the graph represents frequency (f) while the vertical axis represents decibels (dB). The series resonators of the frequency filter may have a periodicity of $\Delta f_1$ and the shunt resonators may have a periodicity of $\Delta f_r$. As can be seen here, the frequency filter has a passband where periodic resonances 304f and 306e align, thus the frequency represented by this passband may be allowed to pass through such a frequency filter with little to no attenuation while the other frequencies may be highly attenuated, as depicted here by the reduced dB level.

Graph 302 may depict the same frequency filter as graph 300; however, the shunt resonators may have been tuned by frequency change of $\Delta f_{tune}$. The dashed lines of the resonances of the shunt resonators may depict the previous resonances of the shunt resonators while the current resonances may be depicted by 308a-308h. The series resonators may not have been tuned and therefore the resonances may remain at 304a-304i. As can be seen in graph 302, the effect of the tuning of the shunt resonators by a frequency change of $\Delta f_{tune}$ may result in a change to the passband equivalent to $\Delta f_1$.

As is depicted here, the period of the resonances of the series resonators and the shunt resonators may be selected to be only slightly smaller or larger than one another. For example, the periodicity of the shunt resonators may be 10% larger than the periodicity of the series resonators. This may enable a small frequency change to the shunt resonators and/or the series resonators to result in a much larger frequency change to a passband of a frequency filter, such as that depicted here, without having a significant impact on the quality of the signal passing through the filter.

The periodicity difference between the series resonators and the shunt resonators may be larger or smaller depending upon the application. For instance, a smaller periodicity may result in a larger tuning range, but may also reduce the width of the passband. A larger periodicity, may result in a wider passband, but may reduce the tuning range. In addition, the tunability of the resonators may also depend upon the material composition of the resonators.

While the series resonators and shunt resonators are depicted here as having 9 and 8 periodic resonances, respectively, this is merely meant to be an example of possible series resonators and shunt resonators. It will be appreciated that any number of periodic resonances may be included in the series resonators and/or the shunt resonators.

In some embodiments, the tuning of the resonators may result in sidelobes. Sidelobes may be frequency bands that are not sufficiently attenuated by the frequency filter. Such sidelobes may be further attenuated by introducing a shunt resonator and/or a series resonator with a third periodicity selected to further attenuate such a sidelobe but maintain the desired passbands.

FIG. 4 depicts illustrative tuning of a frequency filter using bulk acoustic wave (BAW) resonators, according to some embodiments of the present disclosure. FIG. 4 includes a sample BAW resonator 402. The BAW resonator 402 depicted here may be referred to as an over-moded BAW resonator due to the thickness of layer 404, hereinafter over-mode layer 404. Over-mode layer 404 may, as depicted here, enable the BAW resonator 402 to operate at multiple periodic resonances. For example, this BAW resonator 402 may have a periodic resonance at every ½ wavelength of the signal depicted, which would be equivalent to a periodicity of approximately 260 Mhz.

In some embodiments, the shunt resonators and series resonators of FIG. 1 may be BAW resonators. In such embodiments, the periodicity difference between the series resonators and the shunt resonators may be accomplished by utilizing BAW resonators having one thickness of over-mode layer for the series resonators and BAW resonators having a different thickness of over-mode layer for the shunt resonators. Graph 408 depicts such a scenario. Line 410 may represent the resonances of series BAW resonators having an over-mode layer at a first thickness, while line 412 may represent the resonances of shunt BAW resonators having an over-mode layer of a different thickness. As can be seen in this depiction, a frequency filter having such a composition may be capable of a shift in its passband of approximately 260 Mhz where the shunt and/or series resonators only experience an aggregate tuning of approximately 33 Mhz.

Figure 5:
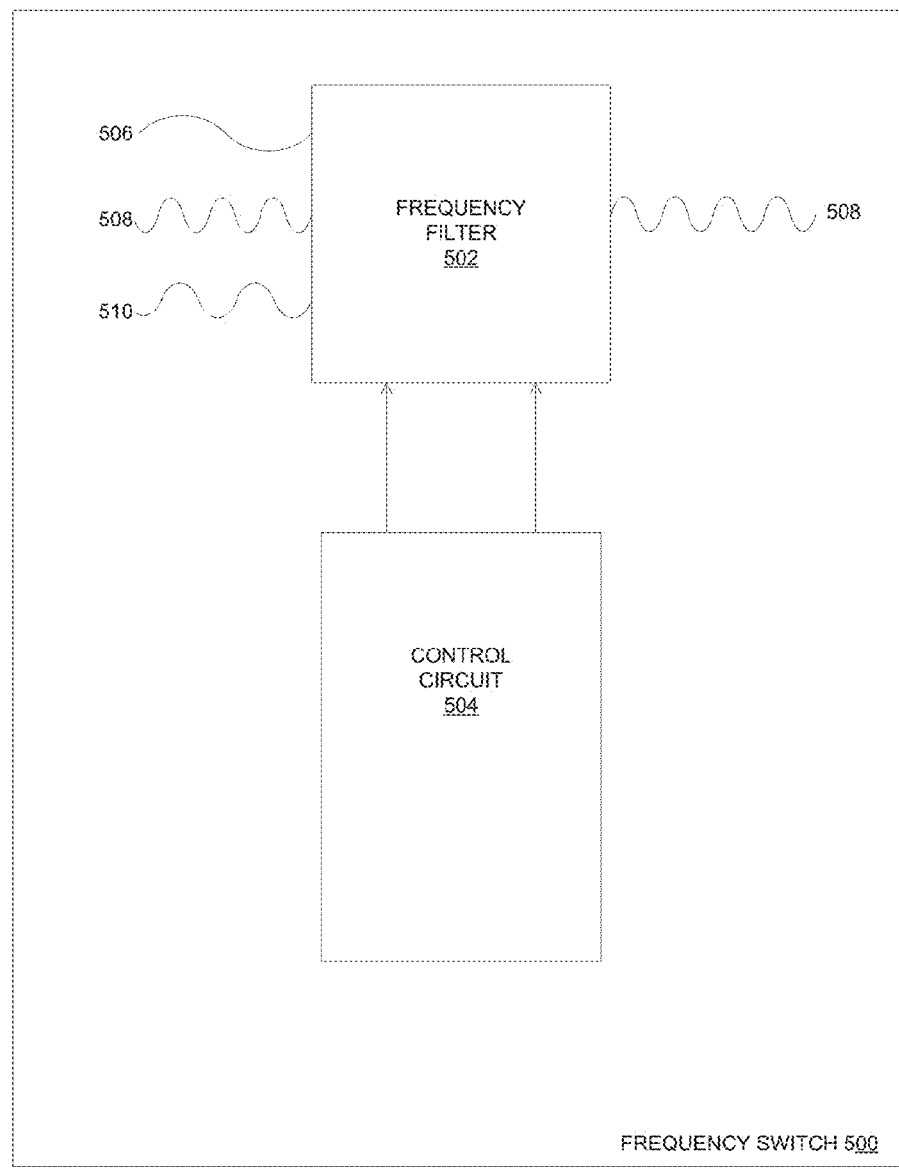
FIG. 5 depicts an illustrative frequency switch, according to some embodiments of the present disclosure.

FIG. 5 depicts an illustrative frequency switch 500, according to some embodiments of the present disclosure. In embodiments, frequency switch 500 may include a frequency filter 502 and a control circuit 504. As depicted here, frequency filter 502 may take as input three different frequencies 506-510. Frequency filter 502 may be configured to attenuate frequencies 506 and 510, and may allow frequency 508 to pass through without attenuating frequency 508. Frequency 508 would therefore be in a passband associated with frequency filter 502.

Control circuit 504 of the frequency switch may provide one or more control signals to frequency filter 502 which may act to tune the resonators of frequency filter 502 in the manner discussed above in reference to FIGS. 2-4. For instance, the control signals received by frequency filter 502 from control circuit 504 may result in a change of the passband associated with frequency filter 502. Such a change could result in a change to the passband associated with frequency filter 502 such that frequency filter 502 may begin to attenuate frequency 508 and may allow frequency 506 or 510 to pass through with little or no attenuation.

While depicted here as two separate units it will be appreciated that, in some embodiments, frequency filter and control circuit may be integrated into a single component. Furthermore, while control circuit 504, as depicted here, may apply an electrical signal to tune the resonators of frequency filter 502 any manner of tuning the resonators is contemplated including, but not limited to, tuning through mechanical stress and/or temperature changes. Any manner of tuning the resonators to accomplish the change in passband discussed above is contemplated.

Figure 6:
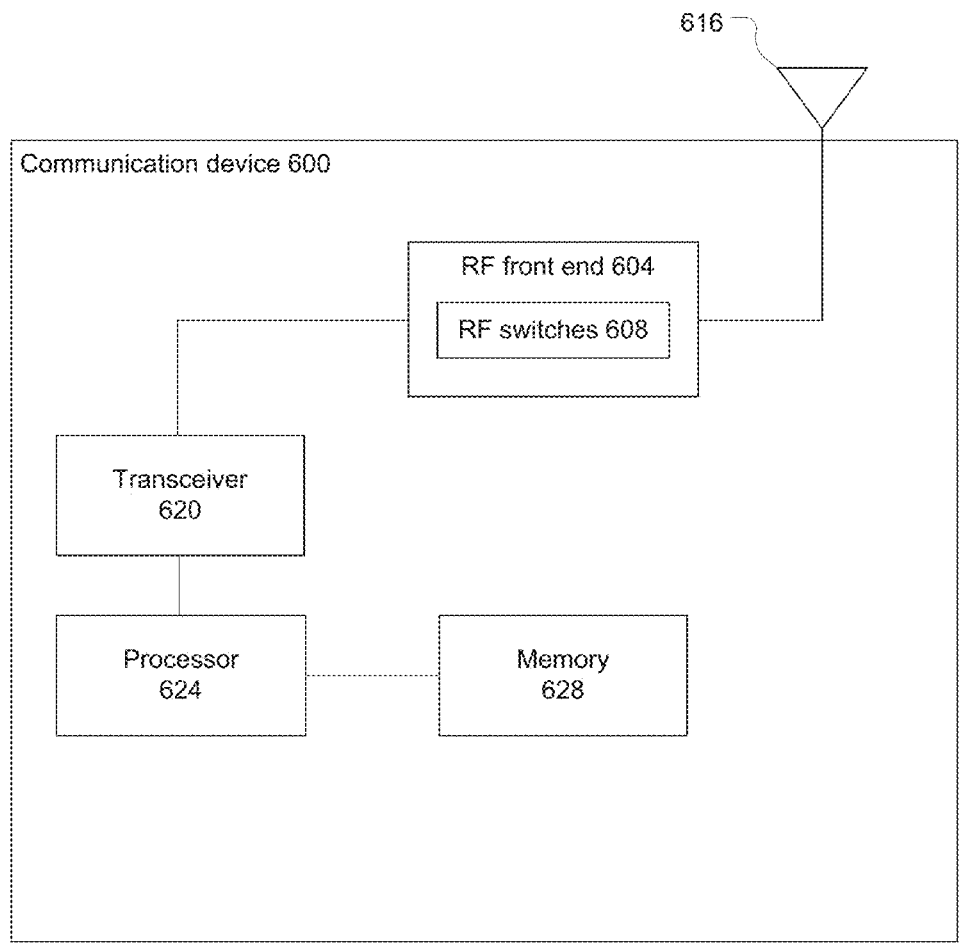
FIG. 6 depicts an illustrative communication device, according to some embodiments of the present disclosure.

A wireless communication device 600 is illustrated in FIG. 6 in accordance with some embodiments. Wireless communication device 600 may have an RF front end 604 to provide various front-end functionality. The RF front end 604 may include one or more RF switches 608, such as that depicted in FIG. 5, to selectively pass RF signal(s) to/from, or within components of the wireless communication device 600. The RF switches 608 may include a frequency filter similar to any of the frequency filters discussed above. Such a communication device may only need 3-4 of the frequency filters described above to operate on 15 or more frequency bands. The RF switches 608 may be deployed in various elements of the RF front end 604 such as, but not limited to, an antenna switch module, a distribution switch, a transmitter, a receiver, etc. The RF front end 604 may also include other elements not specifically shown or discussed such as, but not limited to, amplifiers, converters, other filters, etc.

In addition to the RF front end 604, the wireless communication device 600 may have an antenna structure 616, a transceiver 620, a processor 624, and a memory 628 coupled with each other at least as shown.

The processor 624 may execute a basic operating system program, stored in the memory 628, in order to control the overall operation of the wireless communication device 600. For example, the main processor 624 may control the reception of signals and the transmission of signals by transceiver 620. The main processor 624 may be capable of executing other processes and programs resident in the memory 628 and may move data into or out of memory 628, as desired by an executing process.

The transceiver 620 may receive outgoing data (e.g., voice data, web data, e-mail, signaling data, etc.) from the processor 624, may generate RF signal(s) to represent the outgoing data, and provide the $RF_{in}$ signal(s) to the RF front end 604. Conversely, the transceiver 620 may receive RF signals from the RF front end 604 that represent incoming data. The transceiver 620 may process the RF signals and send incoming signals to the processor 624 for further processing.

In various embodiments, the wireless communication device 600 may be, but is not limited to, a mobile telephone, a paging device, a personal digital assistant, a text-messaging device, a portable computer, a desktop computer, a base station, a subscriber station, an access point, a radar, a satellite communication device, or any other device capable of wirelessly transmitting/receiving RF signals.

Those skilled in the art will recognize that the wireless communication device 600 is given by way of example and that, for simplicity and clarity, only so much of the construction and operation of the wireless communication device 600 as is necessary for an understanding of the embodiments is shown and described. Various embodiments contemplate any suitable component or combination of components performing any suitable tasks in association with wireless communication device 600, according to particular needs. Moreover, it is understood that the wireless communication device 600 should not be construed to limit the types of devices in which embodiments may be implemented.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. A frequency filter comprising:
   one or more series resonators with a first periodicity, wherein the first periodicity is a feature of a frequency response of the one or more series resonators;
   one or more shunt resonators, coupled with the one or more series resonators, with a second periodicity that is different from the first periodicity, wherein the second periodicity is a feature of a frequency response of the one or more shunt resonators; and a control circuit coupled with the one or more series resonators or the one or more shunt resonators configured to cause a change in frequency of the one or more series resonators or the one or more shunt resonators of less than the first or the second periodicity, respectively, and the change in the frequency results in a change to a passband associated with the frequency filter of at least the first or the second periodicity.

2. The frequency filter of claim 1, wherein the change in the frequency of the one or more series resonators or the one or more shunt resonators is based, in part, upon a frequency difference between the first periodicity and the second periodicity.

3. The frequency filter of claim 1, wherein the one or more series resonators or the one or more shunt resonators are bulk acoustic wave (BAW) resonators.

4. The frequency filter of claim 1, further comprising a series resonator or a shunt resonator having a third periodicity, wherein the third periodicity is selected to reduce one or more side-lobes of the passband.

5. The frequency filter of claim 1, wherein the one or more series resonators or the one or more shunt resonators are comprised of piezoelectric materials.

6. The frequency filter of claim 1, wherein the one or more series resonators and the one or more shunt resonators are arranged in one of a ladder or a lattice topology.

7. The frequency filter of claim 1, wherein the first periodicity is a function of a frequency distance from one resonance to a next higher or lower resonance of the one or more series resonators and the second periodicity is a function of a frequency distance from one resonance to a next higher or lower resonance of the one or more shunt resonators.

8. The frequency filter of claim 7, where the frequency distance from one resonance to the next higher or lower resonance of the resonator is not equal for all resonances of either the one or more series resonators or the one or more shunt resonators.

9. The frequency filter of claim 8, wherein at least one of the first periodicity or the second periodicity is an average of a plurality of periods of the one or more series resonators or the one or more shunt resonators.

10. A communication device comprising:
a transceiver;
a frequency filter, coupled to the transceiver, wherein the frequency filter includes:
one or more series resonators with a first periodicity, wherein the first periodicity is a feature of a frequency response of the one or more series resonators; and
one or more shunt resonators with a second periodicity, wherein the second periodicity is a feature of a frequency response of the one or more shunt resonators; and
a controller, coupled to the frequency filter, configured to cause a change in frequency of the one or more series resonators or the one or more shunt resonators which results in a change in a passband of the frequency filter.

11. The communication device of claim 10, wherein the change in the frequency of the one or more series resonators or the one or more shunt resonators is less than the first or the second periodicity, respectively, and the change in the frequency results in the change in the passband associated with the frequency filter of at least the first or the second periodicity.

12. The communication device of claim 11, wherein the change in the frequency of the one or more series resonators or the one or more shunt resonators is based, at least in part, on a frequency difference between the first periodicity and the second periodicity.

13. The communication device of claim 10, wherein the one or more series resonators or the one or more shunt resonators are bulk acoustic wave (BAW) resonators.

14. The communication device of claim 10, further comprising a series resonator or a shunt resonator having a third periodicity, wherein the third periodicity is selected to reduce one or more side-lobes of the passband.

15. The communication device of claim 10, wherein the one or more series resonators or the one or more shunt resonators are comprised of piezoelectric materials.

16. The communication device of claim 10, wherein the one or more series resonators and the one or more shunt resonators are arranged in one of a ladder or a lattice topology.

17. The communication device of claim 10, wherein the frequency filter enables the communication device to communicate on a plurality of frequency bands.

18. The communication device of claim 17, further comprising one or more other similarly provisioned frequency filters which enable the communication device to communicate on a number of frequency bands greater than a total number of frequency filters of the communication device.

19. The communication device of claim 17, wherein the communication device is a selected one of: a cellular phone, a tablet, or a laptop computer.

20. A method of tuning a frequency filter comprising:
determining, by a control circuit, a frequency difference between a first periodicity associated with one or more series resonators of the frequency filter and a second periodicity associated with one or more shunt resonators of the frequency filter, wherein the first periodicity is a feature of a frequency response of the one or more series resonators, wherein the second periodicity is a feature of a frequency response of the one or more shunt resonators, and wherein the first periodicity and the second periodicity are different from one another; and
adjusting, by the control circuit, a frequency of the one or more series resonators or the one or more shunt resonators of the frequency filter based, at least in part, upon the frequency difference between the first periodicity and the second periodicity, to cause a change in a passband frequency of the frequency filter, wherein the change in the passband frequency is greater than the frequency adjustment of the one or more series resonators or the one or more shunt resonators.

21. The method of claim 20, wherein adjusting the frequency of the one or more series resonators or the one or more shunt resonators further comprises adjusting the frequency of the one or more series resonators or the one or more shunt resonators in an amount equal to the frequency difference between the first periodicity and the second periodicity.

22. The method of claim 20, wherein the change in the passband frequency is equal to or greater than the first periodicity or the second periodicity.

23. The method of claim 20, wherein the one or more series resonators or the one or more shunt resonators are bulk acoustic wave (BAW) resonators.

* * * * *

UNITED STATES PATENT AND TRADEMARK OFFICE
CERTIFICATE OF CORRECTION

PATENT NO.         : 9,979,377 B1
APPLICATION NO.    : 13/903821
DATED              : May 22, 2018
INVENTOR(S)        : Robert Aigner It is certified that error appears in the above-identified patent and that said Letters Patent is hereby corrected as shown below:

In the Specification

In Column 4, Line 14, replace "periodicity of $\Delta f_t$." with --periodicity of $\Delta f_2$.--

Signed and Sealed this
Tenth Day of July, 2018

Andrei Iancu
*Director of the United States Patent and Trademark Office*